United States Patent
Kano et al.

(12) 
(10) Patent No.: US 6,330,297 B1
(45) Date of Patent: Dec. 11, 2001

(54) SEMICONDUCTOR INTEGRATED CIRCUIT DEVICE CAPABLE OF READING OUT CHIP-SPECIFIC INFORMATION DURING TESTING AND EVALUATION

(75) Inventors: Hideki Kano; Shinichi Yamada; Satoru Saitoh, all of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/515,651

(22) Filed: Feb. 29, 2000

(30) Foreign Application Priority Data

Apr. 30, 1999 (JP) .................................................. 11-124510

(51) Int. Cl.[7] .................................................. G04F 10/04
(52) U.S. Cl. .............................................. 377/19; 324/527
(58) Field of Search .................... 377/19, 26; 324/158.1, 324/527; 367/174

(56) References Cited

U.S. PATENT DOCUMENTS

| | | | | |
|---|---|---|---|---|
| 4,276,468 | * | 6/1981 | Nagamoto et al. | 235/92 |
| 4,517,684 | * | 5/1985 | Fennel | 377/19 |
| 5,467,304 | * | 11/1995 | Uchida et al. | 365/174 |

* cited by examiner

*Primary Examiner*—Tuan T. Lam
(74) *Attorney, Agent, or Firm*—Arent Fox Kintner Plotkin & Kahn, PLLC

(57) ABSTRACT

A semiconductor integrated circuit device has a data holding section for storing information, a counter for counting the number of externally applied pulses, and a comparison/verification section. The comparison/verification section compares an output of the counter with an output of the data holding section, and verifies whether the outputs match or not. This configuration serves to reduce the number of wiring lines formed from pads to a comparison/verification circuit (a signature circuit), and thereby achieves a reduction in layout area and facilitates efficient layout work.

17 Claims, 11 Drawing Sheets

SEMICONDUCTOR INTEGRATED CIRCUIT DEVICE CAPABLE OF READING OUT CHIP-SPECIFIC INFORMATION DURING TESTING AND EVALUATION

BACKGROUND OF THE INVENTION

1. Field of the Invention

The present invention relates to a semiconductor integrated circuit device and, more particularly, to a semiconductor integrated circuit device capable of reading out chip-specific information during testing and evaluation.

2. Description of the Related Art

With advances in semiconductor manufacturing technology, the miniaturization of semiconductor integrated circuit devices has been advancing and their packing density increasing in recent years and, with this trend, it is required to reduce the chip area. To achieve this, there is a need to reduce as much as possible the long wiring used only for the testing and evaluation of the chip (the wiring is long compared with the chip internal wiring).

It is known in the prior art to provide a semiconductor integrated circuit device (chip) in which information specific to the chip is written using fuses or the like, allowing the information to be read out when testing and evaluating the chip. More specifically, in the prior art semiconductor integrated circuit device, the lot number, wafer number, chip number (code), etc. specific to the chip are written using fuses or the like, and binary data is input from the outside and compared with the internally stored binary data for verification of the chip-specific data such as the code.

The chip-specific lot number, wafer number, etc. are used, for example, to identify the lot, wafer, etc. associated with a defective chip discovered during testing, track down the semiconductor process that caused the defective chip, and so on.

The prior art and its associated problem will be described later, in detail, with reference to the accompanying drawings.

SUMMARY OF THE INVENTION

An object of the present invention is to provide a semiconductor integrated circuit device that permits a reduction in layout area and facilitates efficient layout work, by reducing the number of wiring lines formed from pads to a signature circuit (comparison/verification circuit).

According to the present invention, there is provided a semiconductor integrated circuit device comprising a data holding section for storing information; a counter for counting the number of externally applied pulses; and a comparison/verification section for comparing an output of the counter with an output of the data holding section, and for verifying whether the outputs match or not.

The data holding section may store the information by opening or not opening a fuse. The data holding section may store the information by using a ROM. The information stored in the data holding section may be information specific to the semiconductor integrated circuit device. The information specific to the semiconductor integrated circuit device may include a lot number, a wafer number, or a chip number.

An output of the comparison/verification section may be extracted from the semiconductor integrated circuit device according to whether or not a current flows to a designated pin. The information stored in the data holding section may be read out when testing and evaluating the semiconductor integrated circuit device. The semiconductor integrated circuit device may be a synchronous dynamic random access memory.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to a detailed description of the semiconductor integrated circuit device of the present invention, a prior art semiconductor integrated circuit device and its associated problem will be described with reference to FIGS. 1 and 2.

Figure 1:
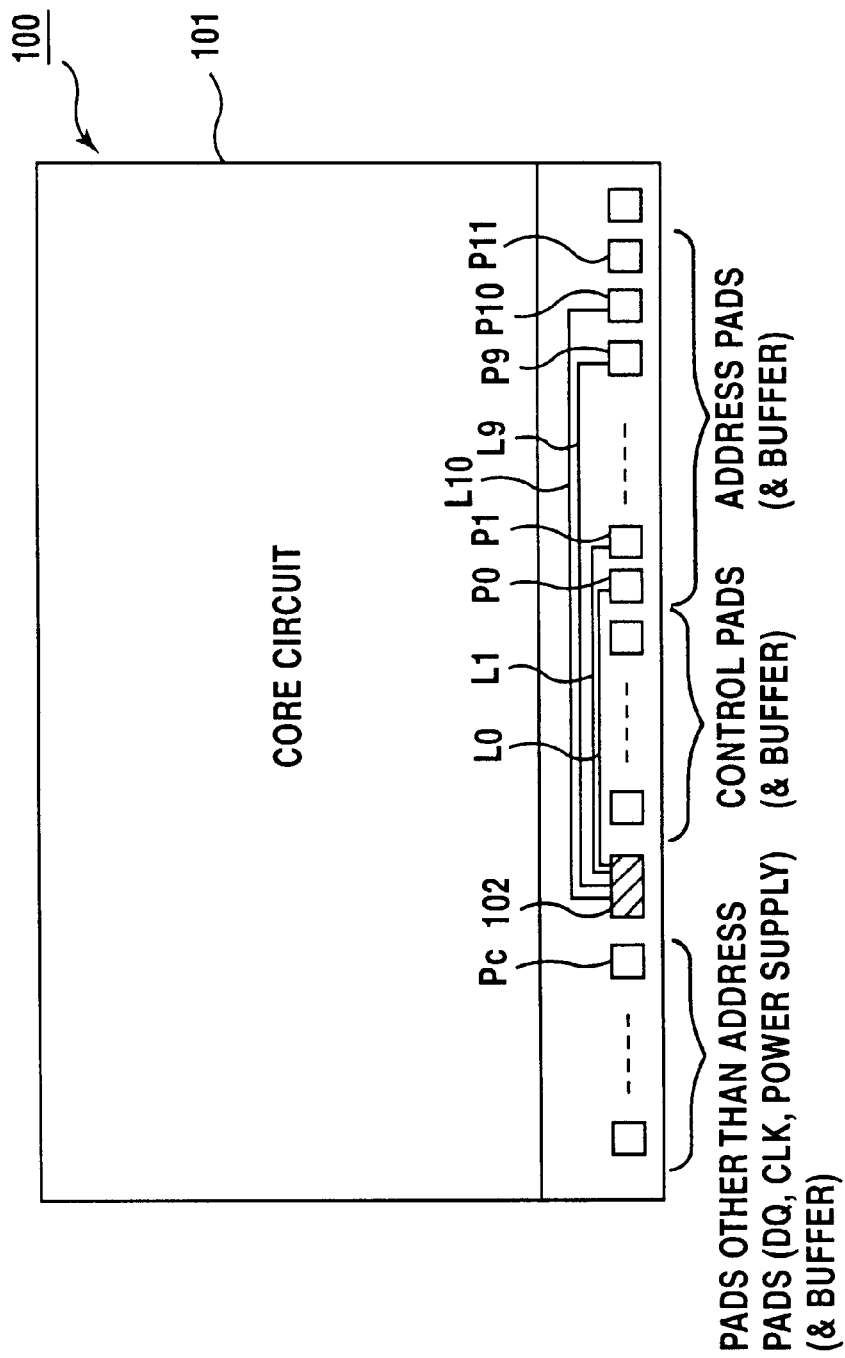
FIG. 1 is a diagram showing, in schematic form, the general configuration of one example of a prior art semiconductor integrated circuit device.
Figure 2:
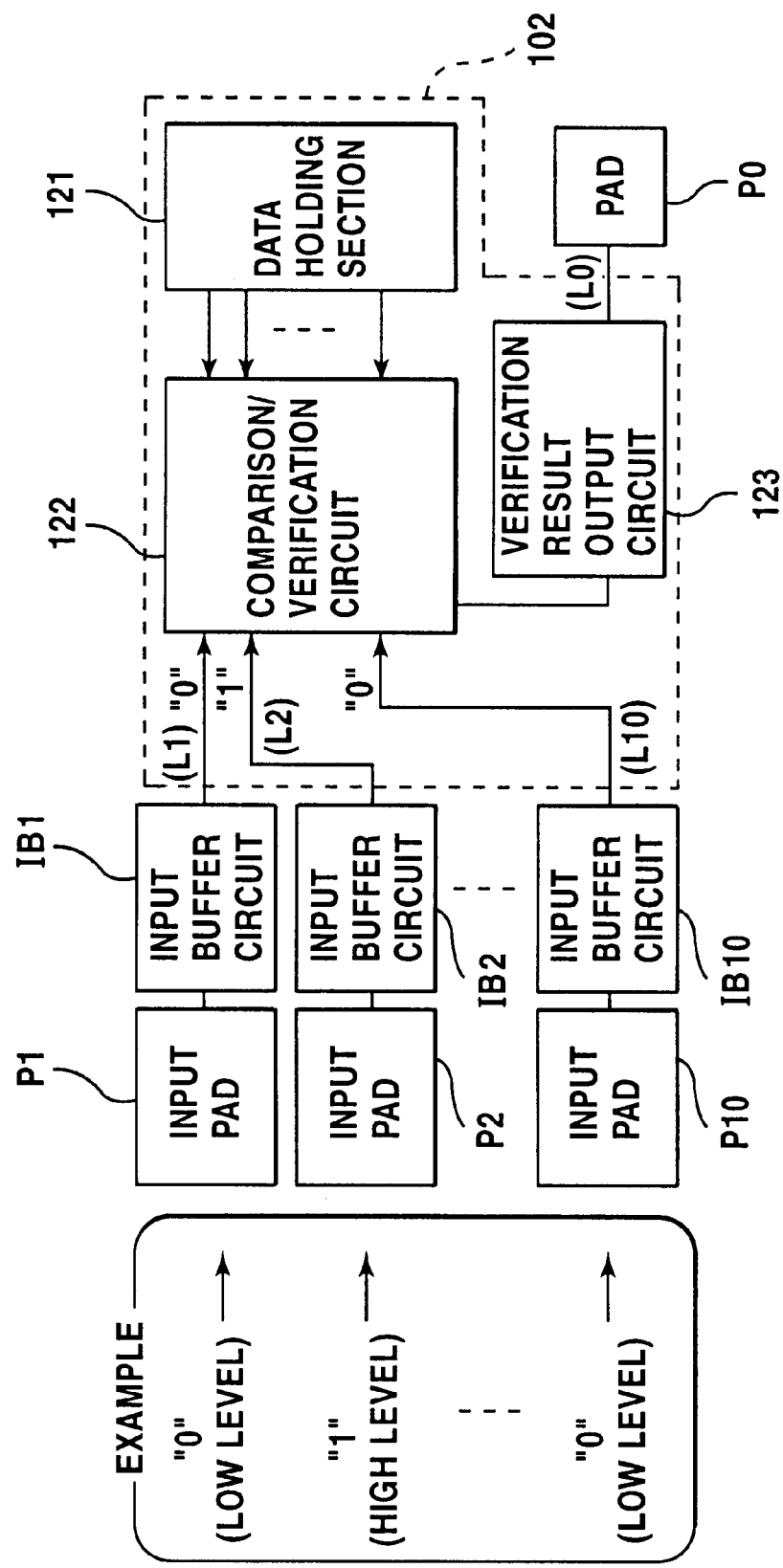
FIG. 2 is a block diagram showing the configuration of the semiconductor integrated circuit device of FIG. 1.

FIG. 1 is a diagram showing, in schematic form, the general configuration of one example of the prior art semiconductor integrated circuit device, and FIG. 2 is a block diagram showing the configuration of the semiconductor integrated circuit device of FIG. 1.

In FIG. 1, reference numeral 100 is the semiconductor integrated circuit device (chip), 101 is a core circuit, 102 is a signature circuit, P0 to P11 are address pads, and Pc is a clock pad. Other pads include control pads (command pads), power supply pads, etc.

The core circuit 101 is the primary circuit block of the semiconductor integrated circuit device, and corresponds, for example, to a functional circuit block specific to each semiconductor integrated circuit device, such as a memory block or the like in a synchronous dynamic random access memory (SDRAM). In FIG. 2, reference numeral 121 is a data holding section, 122 is a comparison/verification circuit, 123 is a verification result output circuit, and IB1 to IB10 are input buffer circuits. The signature circuit 102 in FIG. 1 corresponds to the data holding section 121, comparison/verification circuit 122, and verification result output circuit 123 in FIG. 2.

As shown in FIGS. 1 and 2, the configuration of the prior art semiconductor integrated circuit device is such that in a test mode, data (low level "0" or high level "1") are supplied, for example, in parallel to the plurality of pads (address input pads) P1 to P10, the data are compared with the data stored in the data holding section 121 for verification, and chip-specific data such as the code is read out.

More specifically, the chip-specific lot number, wafer number, and chip number, for example, are written in advance in the data holding section 121 (each item of data is stored, for example, as 10-bit data), and in the test mode, signals supplied from the plurality of (for example, 10) pads P1 to P10 via the input buffer circuits IB1 to IB10 are compared in the comparison/verification circuit 122 with the data stored in the data holding section 121 for verification. If the signal levels supplied from the pads P1 to P10 exactly match the corresponding data stored in the data holding section 121 when compared in the comparison/verification circuit 122, the result is output via the verification result output circuit 123 to a pad P0 for detection.

That is, while sequentially changing the data applied at each of the pads P1 to P10 to the high level "1" or to the low level "0", the output (verification result) of the verification result output circuit 123 is detected at the pad P0, and the data stored in the data holding section 121 is identified from the levels of the signals applied at the input pads P1 to P10 when the output of the verification result output circuit 123 indicates a match.

This configuration, as can be seen from FIG. 1, requires a plurality of (for example, 10) signal supply wiring lines L1 to L10 for supplying the signals from the pads P1 to P10 to the signature circuit 102, as well as a signal output wiring line L0 for delivering the output of the signature circuit 102 (verification result output circuit 123) to the pad P0 for detection. When the semiconductor integrated circuit device is an SDRAM, for example, its address input pads can be used as the pads P0 to P10, and in cases other than an SDRAM, the pads P0 to P10 can be made of various other pads that are usually used during normal operation.

As described above, in the prior art semiconductor integrated circuit device, when reading out the chip-specific data (lot number, wafer number, chip number, etc.) from the data holding section 121 in the test mode, signals with varying levels are supplied to the plurality of pads P1 to P10, and the data stored in the data holding section 121 (corresponding to the levels of the pads P1 to P10) is verified based on the output (comparison/verification result) of the signature circuit 102 (verification result output circuit 123). Accordingly, the signal supply wiring lines L1 to L10 (for example, 10 lines) for supplying the signals from the plurality of pads P1 to P10 to the signature circuit 102 have had to be provided.

That is, in the prior art semiconductor integrated circuit device, since data is input to the pads P1 to P10, the number of which equals the number of bits of the data, and the signals are input to the signature circuit 102 (comparison/verification circuit 122) via the wiring lines, the number of which equals the number of bits of the data, many long wiring lines have had to be provided, and this has posed an obstacle to the reduction of chip area. The number of bits of the data and the number of wiring lines from the pads to the signature circuit vary from one semiconductor integrated circuit device to another.

According to the present invention, there is provided a semiconductor integrated circuit device which comprises a data holding section for storing information, a counter for counting the number of externally applied pulses, and a comparison/verification section for comparing an output of the counter with an output of the data holding section, and for verifying whether the outputs match or not.

According to the semiconductor integrated circuit device of the present invention, the counter counts the number of externally applied pulses, and the comparison/verification section compares the output of the counter with the output of the data holding section to verify whether the outputs match or not.

Here, a test circuit (tester) external to the semiconductor integrated circuit device is provided with a counter that counts the number of pulses applied to the semiconductor integrated circuit device, and when the verification result from the semiconductor integrated circuit device (comparison/verification section) indicates a match, the data stored in the data holding section is identified by referring to the value of the counter provided in the tester.

This configuration serves to reduce the number of wiring lines from the pads to the verification circuit, and thereby achieves a reduction in layout area and facilitates efficient layout work.

For the counter, a binary counter may be used. In this case the externally applied pulses are converted into binary numbers for output to the comparison/verification section. The code information specific to the chip (semiconductor integrated circuit device), stored in the data holding section, consists of the lot number, wafer number, chip number, etc. specific to the chip. The information is read out in the test mode and used, for example, to identify the lot, wafer, etc. associated with a defective chip discovered during testing, track down the semiconductor process that caused the defective chip, and so on.

Embodiments of the semiconductor integrated circuit device according to the present invention will be described below with reference to accompanying drawings.

Figure 3:
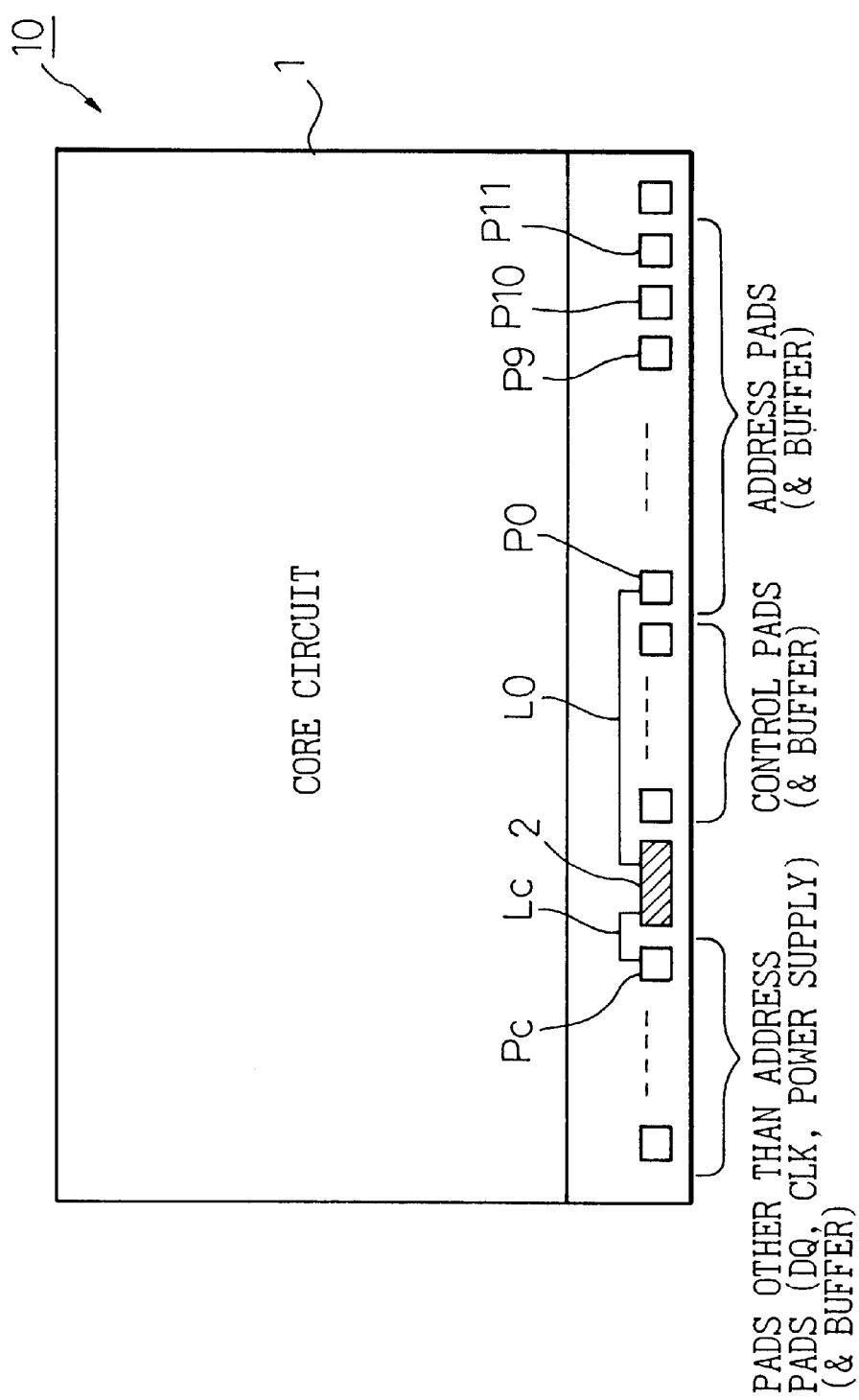
FIG. 3 is a diagram showing in schematic form the general configuration of one embodiment of a semiconductor integrated circuit device according to the present invention.
Figure 4:
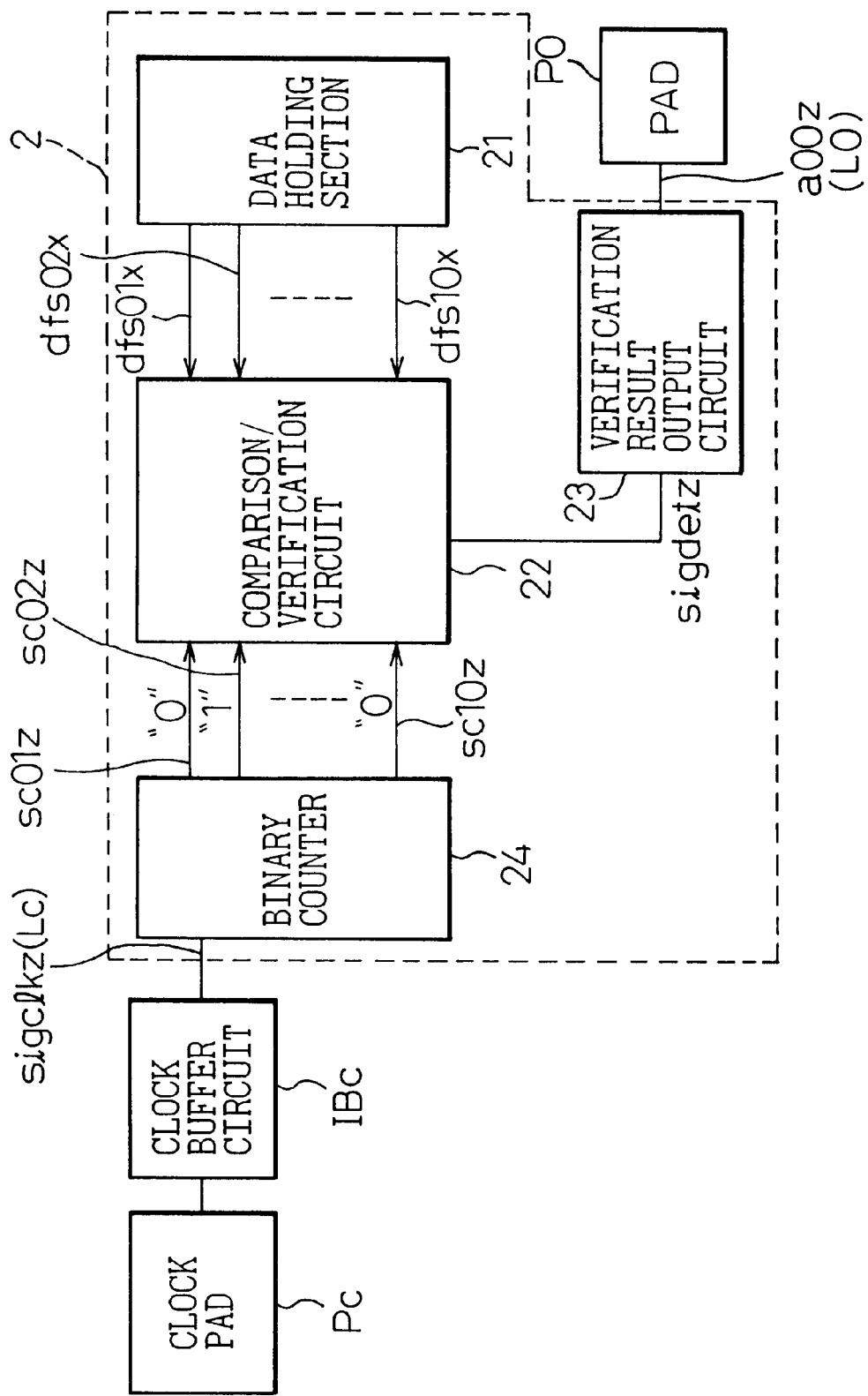
FIG. 4 is a block diagram showing the configuration of the semiconductor integrated circuit device of FIG. 3.

FIG. 3 is a diagram showing in schematic form the general configuration of one embodiment of the semiconductor integrated circuit device according to the present invention, and FIG. 4 is a block diagram showing the configuration of the semiconductor integrated circuit device of FIG. 3. In FIG. 3, reference numeral 10 is the semiconductor integrated circuit device (chip), 1 is a core circuit, 2 is a signature circuit, P0 to P11 are address pads, and Pc is a clock pad. Other pads include control pads (command pads), power supply pads, etc.

The core circuit 10 is the primary circuit block of the semiconductor integrated circuit device, and corresponds, for example, to a functional circuit block specific to each semiconductor integrated circuit device, such as a memory block or the like in an SDRAM. In FIG. 4, reference numeral 21 is a data holding section, 22 is a comparison/verification circuit, 23 is a verification result output circuit, 24 is a binary counter, and IBc is a clock buffer circuit. The signature circuit 2 in FIG. 3 corresponds to the data holding section 21, comparison/verification circuit 22, verification result output circuit 23, and binary counter 24 in FIG. 4.

As shown in FIGS. 3 and 4, in the semiconductor integrated circuit device of this embodiment, pulses (pulse signal) are input, for example, to one pad (for example, the clock pad) Pc, the pulse signal is counted by the binary counter 24 in the signature circuit 2 to generate binary number data, and the binary number data is supplied to the comparison/verification circuit 22 which compares it with the data stored in the data holding section 21 for verification. It is assumed here that the pulse signal applied to the pad Pc in the test mode is a special clock different from the clock supplied during normal operation (for example, clock pulses slower than the clock in normal operation).

As shown in FIG. 4, the pulse signal (clock) applied to the pad Pc is input via the buffer circuit IBc to the binary counter 24 for counting, and binary number data representing the result of counting the pulse signal is output from the binary counter 24. The comparison/verification circuit 22 compares the binary number data, the output of the binary counter 24, with the data stored in the data holding section 21 and, when they match, outputs the verification result indicating a match at the pad P0 through the verification result output circuit 23. More specifically, when the output of the binary counter 24 matches the output of the data holding section 21, the verification result (match) from the comparison/verification circuit 22 is output, for example, by causing a current to flow to the pad P0.

When the current flown to the pad P0 is detected, for example, the pulse signal (pulse count) at that time is also counted by a binary counter (for example, a tester) attached externally to the semiconductor integrated circuit device, and the chip-specific data stored in the data holding section 21 is verified based on that value (pulse count). The chip-specific data (the data stored in the data holding section 21) refers here to the lot number, wafer number, chip number, etc. specific to the chip, and each item of data consists, for example, of 10 bits.

In this way, according to the semiconductor integrated circuit device of this embodiment, since the external pulse signal is input one bit at a time in a serial manner, the number of wiring lines from the input pads to the signature circuit (comparison/verification circuit) in the semiconductor integrated circuit device can be reduced to one (in addition to this, one wiring line is needed to output the result of the comparison/verification), thus making it possible to reduce the chip size; furthermore, since there is no need to provide many long wiring lines, the present embodiment provides greater freedom in determining the layout position of the comparison/verification circuit (signature circuit), and contributes to enhancing the efficiency of the layout work of the semiconductor integrated circuit device. More specifically, the wiring lines L1 to L10 connecting between the signature circuit (102) and the pads P1 to P10 in FIG. 1 can be eliminated. To summarize, the present embodiment only requires the wiring line Lc connecting between the clock pad Pc at which pulses are applied and the signature circuit 2 and the wiring line L0 connecting between the signature circuit 2 and the pad P0 at which the verification result is output.

Figure 5:
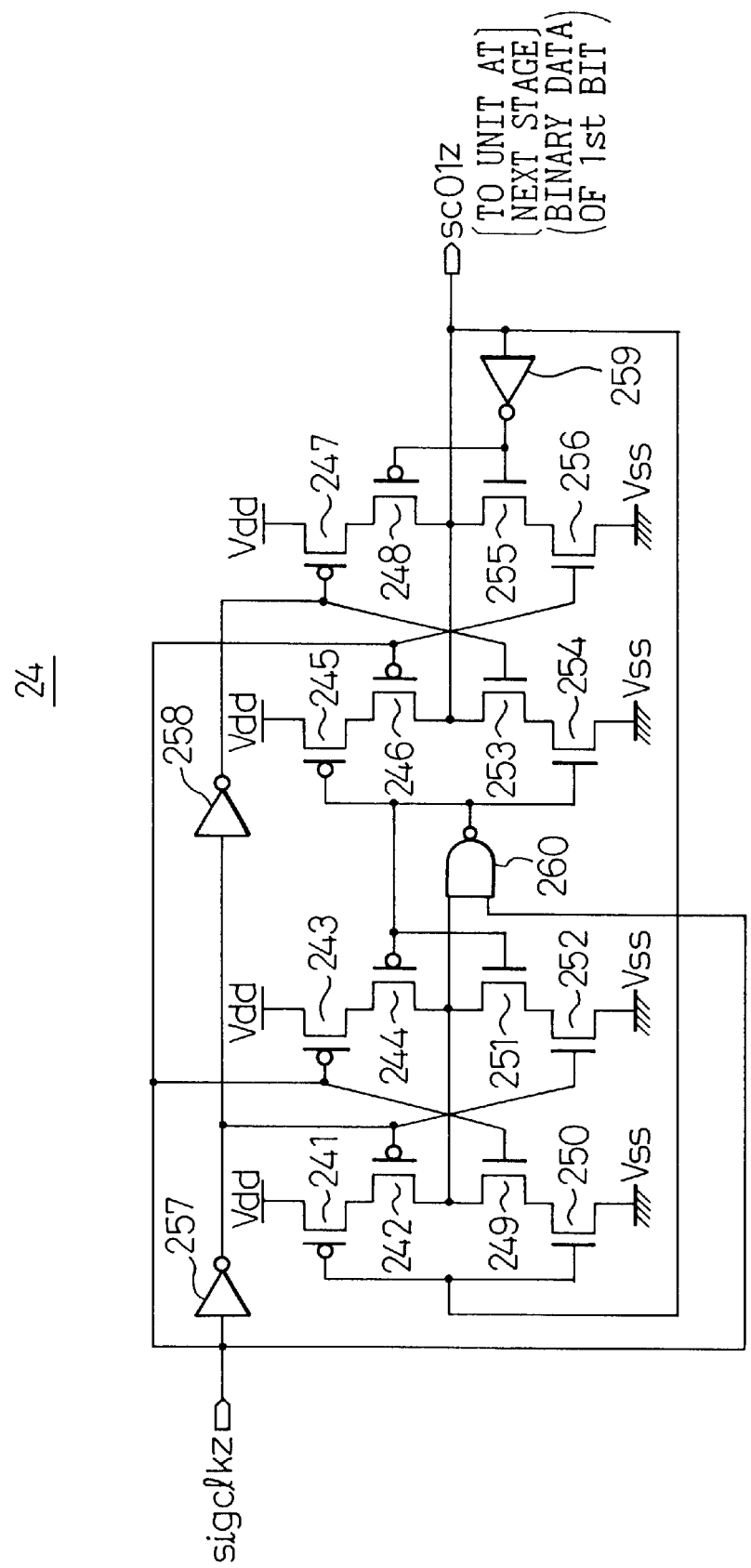
FIG. 5 is a circuit diagram showing a basic unit in one example of a binary counter in the semiconductor integrated circuit device of FIG. 4.

FIG. 5 is a circuit diagram showing a basic unit (unit circuit) in one example of the binary counter in the semiconductor integrated circuit device of FIG. 4. The binary counter 24 is formed by a cascaded series of a plurality of (for example, 10) such unit circuits one of which is shown in FIG. 5.

As shown in FIG. 5, each unit circuit of the binary counter 24 comprises P-type MOS transistors 241 to 248, N-type MOS transistors 249 to 256, inverters 257 to 259, and a NAND gate 260. In the binary counter 24, a pulse signal sigclkz is input, via the pad Pc and the buffer circuit IBc, to the unit circuit at the first stage which then outputs binary data sc01z representing the first bit. This binary data is supplied as an input signal to the unit circuit at the next stage (second bit). Here, the unit circuits are provided in the quantity (for example, 10) corresponding, for example, to the chip-specific data (for example, lot number, wafer number, and chip number, each of 10 bits) stored in the data holding section 21. Also, the letter "z" added at the end of a signal (for example, sigclkz, sc01z, testz, sigdetz, etc.) indicates that the signal is set to a high level "1" when active (output), while the letter "x" added at the end of a signal (for example, testx, dfs01x, etc.) indicates that the signal is set to a low level "0" when active (output).

The binary counter 24 counts the input pulse signal sigclkz and outputs, for example, binary signals of 10 bits, sc01z–sc10z, to the comparison/verification circuit 22, as shown in FIG. 4.

Figure 6:
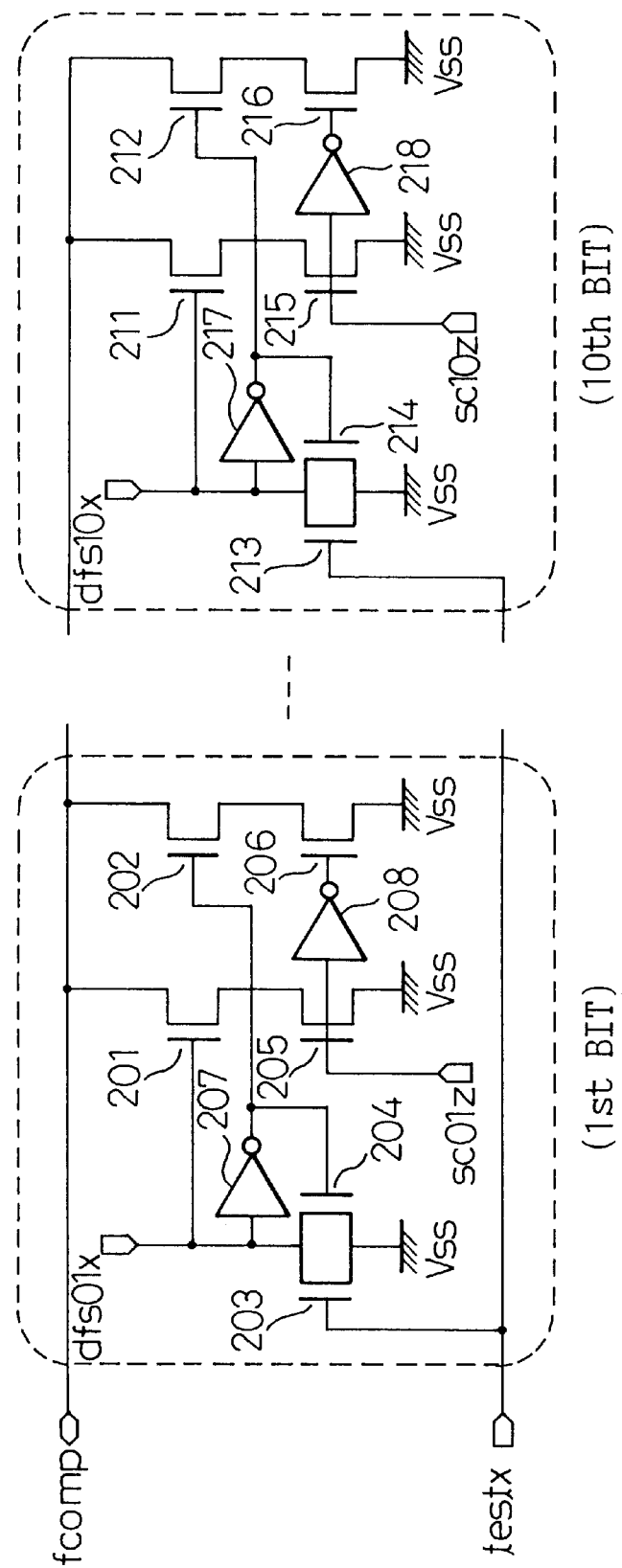
FIG. 6 is a circuit diagram (part 1) showing one example of a comparison/verification circuit in the semiconductor integrated circuit device of FIG. 4.
Figure 7:
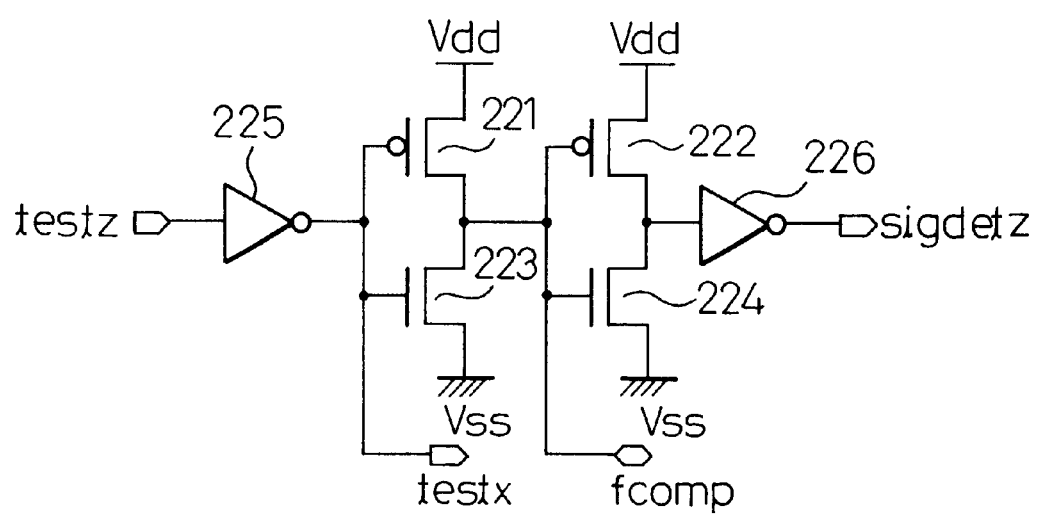
FIG. 7 is a circuit diagram (part 2) showing one example of the comparison/verification circuit in the semiconductor integrated circuit device of FIG. 4.

FIGS. 6 and 7 are circuit diagrams showing one example of the comparison/verification circuit in the semiconductor integrated circuit device of FIG. 4.

FIG. 6 shows the comparison section of the comparison/verification circuit 22, in which the output, sc01z–sc10z, of the binary counter 24 (for example, 10-bit signal) is compared with the output, dfs01x–dfs10x, of the data holding section 21 (for example, lot number, wafer number, and chip number, each represented by a 10-bit signal). This comparison section comprises N-type MOS transistors 201 to 206 (211 to 216) and inverters 207 and 208 (217 and 218) for each bit, and is configured to compare the output, sc01z (sc10z), of the binary counter 24 with the output, dfs01x (dfs10x), of the data holding section 21 on a bit-by-bit basis, and to output a comparison result signal fcomp held at the high level "1" when both outputs match in every bit. If the output of the binary counter 24 does not match the output of the data holding section 21 in any one bit, a current flows through the comparator circuit associated with the mismatched bit, and the comparison result signal fcomp is forced to the low level "0". For example, the output, sc01z, of the binary counter 24 matches the output, dfs01x, of the data holding section 21 when the signal sc01z is at the high level "1" and the signal dfs01x is at the low level "0", or when the signal sc01z is at the low level "0" and the signal dfs01x is at the high level "1".

FIG. 7 shows the circuit configuration of the verification section of the comparison/verification circuit 22. The verification section comprises P-type MOS transistors 221 and 222, N-type MOS transistors 223 and 224, and inverters 225 and 226. The verification section is supplied with the test signals testx, testz and comparison result signal fcomp, and outputs the verification result signal sigdetz. More specifically, in the test mode, the test signal testz is set to the high level "1" and testx to the low level "0", and when the output signals, sc01z to sc10z, of the binary counter 24 exactly match the corresponding output signals, dfs01x to dfs10x, of the data holding section 21, and the comparison result signal fcomp from the comparison section of FIG. 6 thus remains at the high level "1", the verification result signal sigdetz output from the verification section is at the high level "1". Here, the P-type MOS transistor 221 is configured as a small-size transistor (current-delivering capability is small) and, as earlier noted, when the output of the binary counter 24 mismatches the output of the data holding section 21 in any one bit, the comparison result signal fcomp is forced to the low level "0".

Figure 8:
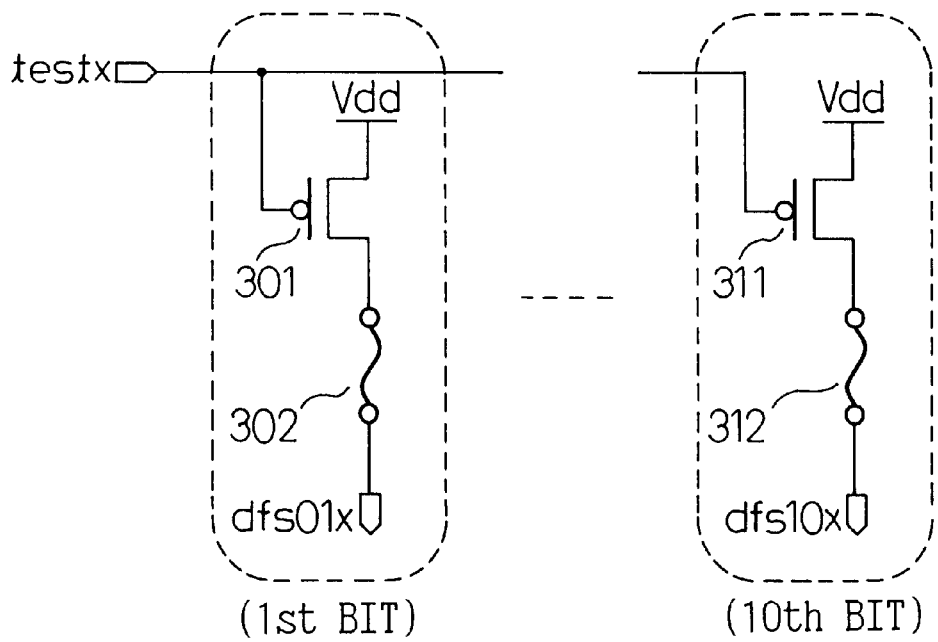
FIG. 8 is a circuit diagram showing one example of a data holding section in the semiconductor integrated circuit device of FIG. 4.

FIG. 8 is a circuit diagram showing one example of the data holding section in the semiconductor integrated circuit device of FIG. 4.

As shown in FIG. 8, the data holding section 21 comprises, for example, a P-type MOS transistor 301 (311) and a fuse 302 (312) for each bit, and performs control to open or not open the fuse 302 according to the data to be stored. That is, when the test signal (low level "0") testx is applied, and the transistor 301 is turned on, if the fuse 302 is not open, the output signal dfs01x goes to the high level "1", and if the fuse is open, the output signal dfs01x is at the low level "0". The necessary data can thus be stored in the data holding section 21. When storing the lot number, wafer number, and chip number, each of 10 bits, in the data holding section 21, a total of 30 unit circuits, each comprising the transistor 301 and fuse 302, are provided, one for each bit.

In the above configuration, the fuse 302 may be opened by directing a laser beam onto the chip, or by applying a high voltage using a known circuit. Further, the data holding section 21 may be constructed using a conventional ROM, rather than fuses for storing the data.

Figure 9:
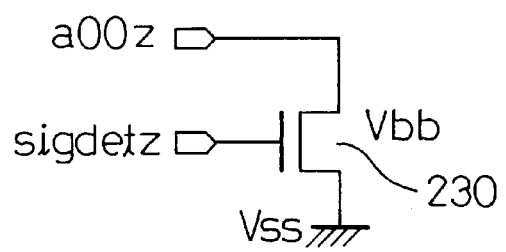
FIG. 9 is a circuit diagram showing one example of a verification result output circuit in the semiconductor integrated circuit device of FIG. 4.

FIG. 9 is a circuit diagram showing one example of the verification result output circuit in the semiconductor integrated circuit device of FIG. 4.

As shown in FIG. 9, the verification result output circuit 23 is constructed from an N-type MOS transistor 230, whose drain is connected to the pad P0 and whose gate is supplied with the verification result signal sigdetz. With this configuration, when the output signals, sc01z to sc10z, of the binary counter 24 match the corresponding output signals, dfs01x to dfs10x, of the data holding section 21, and the verification result signal sigdetz is at the high level "1", the transistor 230 is turned on, causing a current to flow to the pad P0 (a00z), for example. The verification result can thus be checked externally. In the example shown in FIG. 9, the back bias of the transistor 230 is set to a low voltage Vbb lower than the voltage Vss in order to reduce the amount of current flowing through the transistor.

Figure 10:
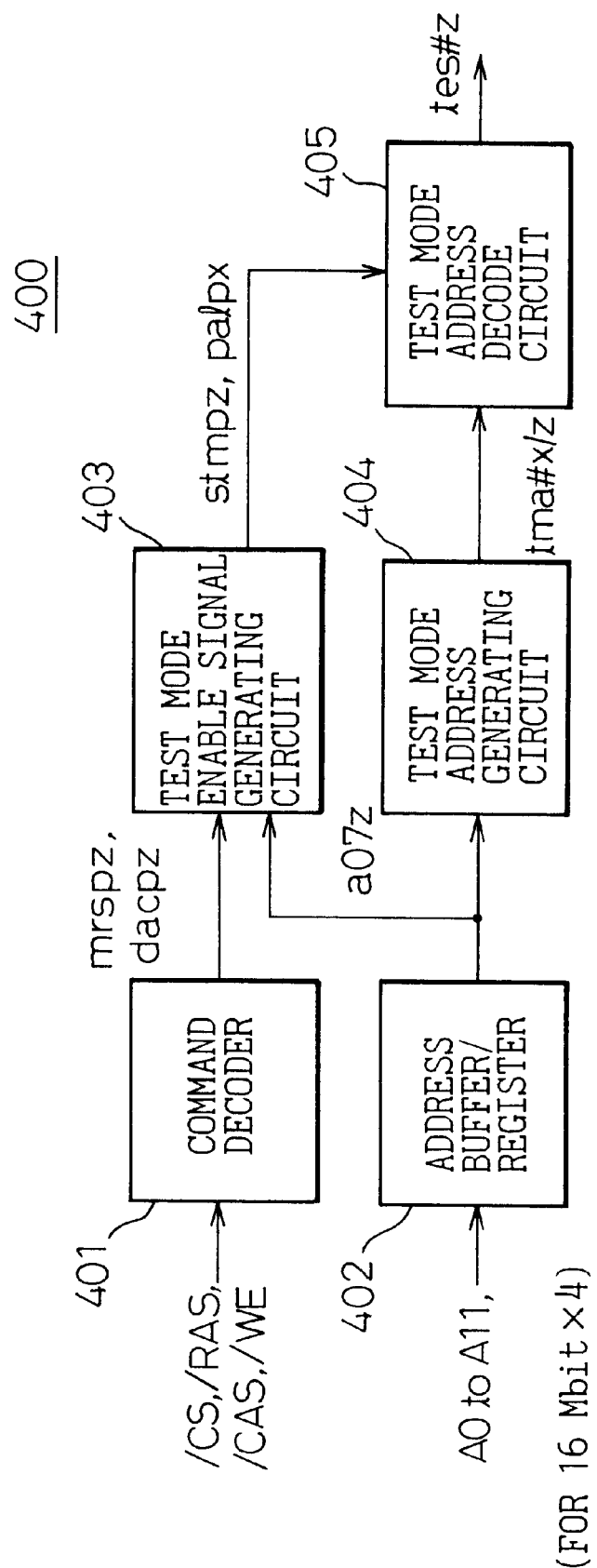
FIG. 10 is a circuit diagram showing one example of a test mode enable signal generating circuit for application in the semiconductor integrated circuit device of the present invention.

FIG. 10 is a circuit diagram showing one example of a test mode enable signal generating circuit for application in the semiconductor integrated circuit device (for example, an SDRAM) of the present invention. In FIG. 10, reference numeral 401 is a command decoder, 402 is an address buffer/register, 403 is a test mode enable signal generating circuit, 404 is a test mode address generating circuit, and 405 is a test mode address decode circuit. Further, reference character /CS designates a chip enable signal, /RAS a row address strobe signal, /CAS a column address strobe signal, /WE a write enable signal, and A0 to A11 address signals.

As shown in FIG. 10, the test mode enable signal generating circuit 400 for generating a test mode enable signal tes#z comprises the command decoder 401, address buffer/register 402, test mode enable signal generating circuit 403, test mode address generating circuit 404, and test mode address decode circuit 405.

For example, in an SDRAM, when entering a test mode, a mode register set command MRS is used in combination with an address (when measuring at A0, an address other than A0) and, when exiting the test mode, a command PALL for precharging all banks is used. In FIG. 10, mrspz is a signal that is output at the time of the mode register set (MRS), and dacpz is a signal that is output at the time of the all banks precharge (PALL). Here, when lot number, wafer number, and chip number information is stored as the chip-specific data in the data holding section (21), for example, which information item is to be selected is defined by the address used when entering the test mode.

Figure 11:
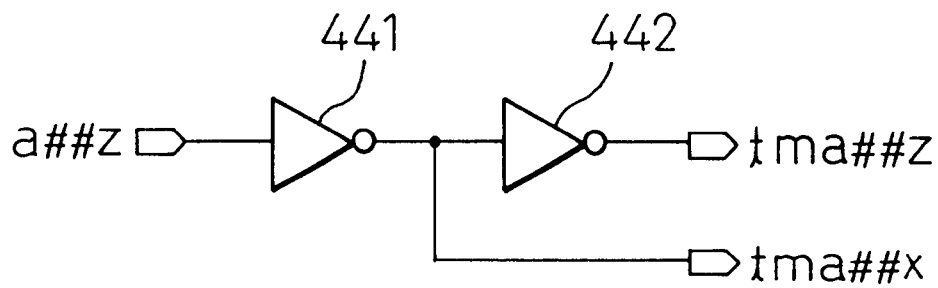
FIG. 11 is a circuit diagram showing one example of a test mode address generating circuit for application in the semiconductor integrated circuit device of the present invention.

FIG. 11 is a circuit diagram showing one example of the test mode address generating circuit for application in the semiconductor integrated circuit device of the present invention.

As shown in FIG. 11, the test mode address generating circuit 404 comprises two inverters 441 and 442, and generates, from the internal address signal a##z supplied via the address buffer/register 402, test mode address signals tma##x and tma##z for output to the test mode address decode circuit 405.

Figure 12:
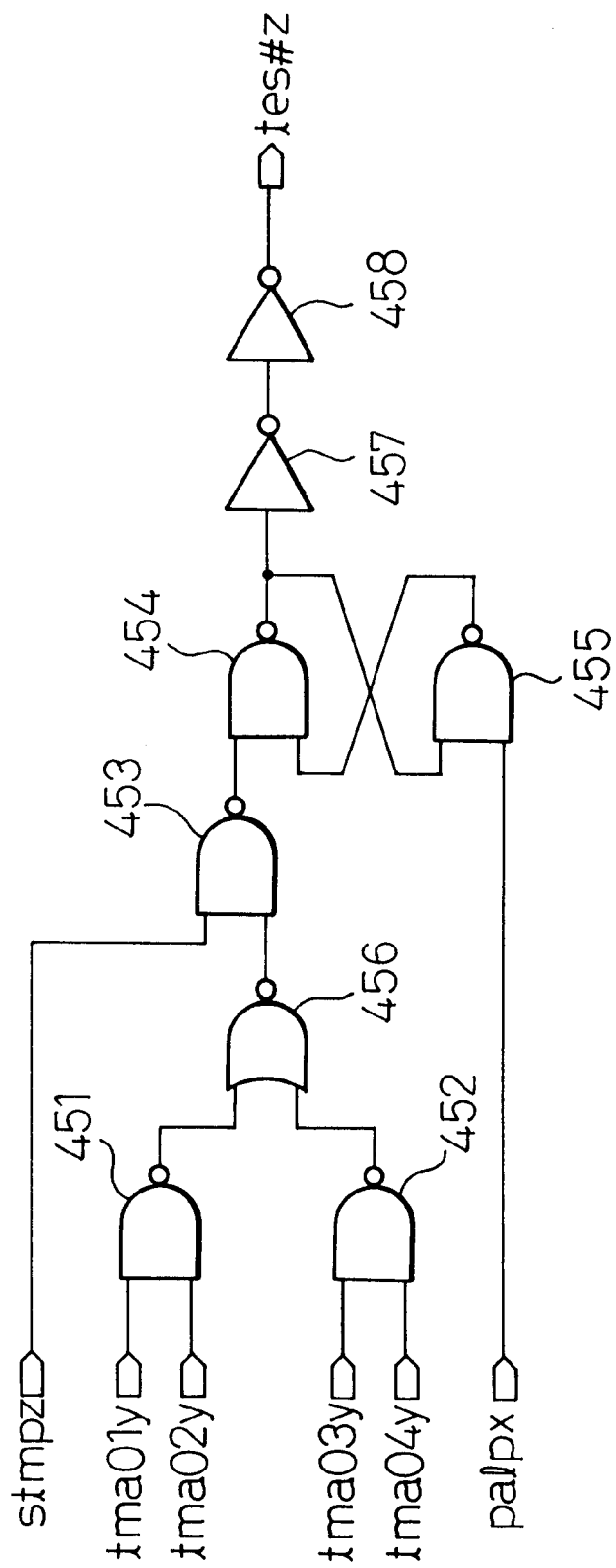
FIG. 12 is a circuit diagram showing one example of a test mode address decode circuit for application in the semiconductor integrated circuit device of the present invention.

FIG. 12 is a circuit diagram showing one example of the test mode address decode circuit for application in the semiconductor integrated circuit device of the present invention.

As shown in FIG. 12, the test mode address decode circuit 405 comprises AND gates 451 to 455, a NOR gate 456, and inverters 457 and 458, and generates a test mode state signal tes#z from the test mode address signals tma01y to tma04y (tma01x/z to tma04x/z) supplied from the test mode address generating circuit 404 and the test mode start signal stmpz and test mode exiting precharge signal palpx supplied from the test mode enable signal generating circuit 403. There are multiple kinds (#) of test modes, from which the test mode designated by the signal tes#z is activated.

Although the above embodiment has been described dealing primarily with an SDRAM as an example of the semiconductor integrated circuit device, it will be appreciated that the present invention is applicable not only to SDRAMs but also to various other semiconductor integrated circuit devices. Furthermore, the data holding section 21, the comparison/verification circuit 22, the verification result output circuit 23, the binary counter 24, and the test mode enable signal generating circuit 400 and its related circuitry are not limited in configuration to those described in the above embodiment, but various modifications can be made. It will also be recognized that the data stored in the data holding section 21 (the information read out in the test mode) is not limited to consisting of information such as the lot number, wafer number, and chip number.

As described in detail above, according to the present invention, a semiconductor integrated circuit device can be provided that achieves reductions in layout area and facilitates efficient layout work, by reducing the number of wiring lines formed between the pads and the signature circuit (comparison/verification circuit).

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit device comprising:
   a data holding section for storing device information including a lot number, a wafer number or a chip number;
   a counter for counting the number of externally applied pulses; and
   a comparison/verification section for comparing an output of said counter with an output of said data holding section, and for verifying whether the outputs match or not.

2. The semiconductor integrated circuit device as claimed in claim 1, wherein said data holding section stores the device information by opening or not opening a fuse.

3. The semiconductor integrated circuit device as claimed in claim 1, wherein said data holding section stores the device information by using a ROM.

4. The semiconductor integrated circuit device as claimed in claim 1, wherein said semiconductor integrated circuit device is a synchronous dynamic random access memory.

5. A semiconductor integrated circuit device comprising:

a data holding section for storing information;

a counter for counting the number of externally applied pulses; and a comparison/verification section for comparing an output of said counter with an output of said data holding section, and for verifying whether the outputs match or not, wherein a verification result output circuit controls to flow a current or not to flow said current through a pad in response to a result from said comparison/verification section.

6. The semiconductor integrated circuit device as claimed in claim 5, wherein said data holding section stores the information by opening or not opening a fuse.

7. The semiconductor integrated circuit device as claimed in claim 5, wherein said data holding section stores the information by using a ROM.

8. The semiconductor integrated circuit device as claimed in claim 5, wherein the information stored in said data holding section is information specific to said semiconductor integrated circuit device.

9. The semiconductor integrated circuit device as claimed in claim 8, wherein the information specific to said semiconductor integrated circuit device includes a lot number, a wafer number, or a chip number.

10. The semiconductor integrated circuit device as claimed in claim 5, wherein the information stored in said data holding section is read out when testing and evaluating said semiconductor integrated circuit device.

11. The semiconductor integrated circuit device as claimed in claim 5, wherein said semiconductor integrated circuit device is a synchronous dynamic random access memory.

12. A semiconductor integrated circuit device comprising:

a data holding section for storing information;

a counter for counting the number of externally applied pulses; and a comparison/verification section for comparing an output of said counter with an output of said data holding section, and for verifying whether the outputs match or not, wherein the information stored in said data holding section is read out when testing and evaluating said semiconductor integrated circuit device.

13. The semiconductor integrated circuit device as claimed in claim 12, wherein said data holding section stores the information by opening or not opening a fuse.

14. The semiconductor integrated circuit device as claimed in claim 12, wherein said data holding section stores the information by using a ROM.

15. The semiconductor integrated circuit device as claimed in claim 12, wherein the information stored in said data holding section is information specific to said semiconductor integrated circuit device.

16. The semiconductor integrated circuit device as claimed in claim 15, wherein the information specific to said semiconductor integrated circuit device includes a lot number, a wafer number, or a chip number.

17. The semiconductor integrated circuit device as claimed in claim 12, wherein said semiconductor integrated circuit device is a synchronous dynamic random access memory.

* * * * *